(12) United States Patent
Hasegawa

(10) Patent No.: US 9,570,537 B2
(45) Date of Patent: Feb. 14, 2017

(54) SEMICONDUCTOR DEVICE

(71) Applicant: SEIKO INSTRUMENTS INC., Chiba (JP)

(72) Inventor: Hisashi Hasegawa, Chiba (JP)

(73) Assignee: SII Semiconductor Corporation (JP)

( * ) Notice: Subject to any disclaimer, the term of this patent is extended or adjusted under 35 U.S.C. 154(b) by 0 days.

(21) Appl. No.: 14/161,894

(22) Filed: Jan. 23, 2014

(65) Prior Publication Data
US 2014/0210042 A1 Jul. 31, 2014

(30) Foreign Application Priority Data

Jan. 25, 2013 (JP) ................................. 2013-012386
Nov. 27, 2013 (JP) ................................. 2013-245290

(51) Int. Cl.
*H01L 23/525* (2006.01)
*H01L 49/02* (2006.01)
*H01L 27/06* (2006.01)

(52) U.S. Cl.
CPC ........... *H01L 28/20* (2013.01); *H01L 23/5258* (2013.01); *H01L 27/0629* (2013.01); *H01L 2924/0002* (2013.01)

(58) Field of Classification Search
CPC ............................................... H01L 21/76831
USPC ......................................................... 257/529
See application file for complete search history.

(56) References Cited

U.S. PATENT DOCUMENTS

| 6,525,398 | B1* | 2/2003 | Kim ..................... H01L 21/768 257/529 |
| 2002/0179998 | A1* | 12/2002 | Lee et al. ...................... 257/529 |
| 2003/0173597 | A1* | 9/2003 | Kamiya ....................... 257/209 |
| 2011/0079873 | A1* | 4/2011 | Oshima et al. ............... 257/529 |
| 2011/0156161 | A1* | 6/2011 | Tseng et al. .................. 257/379 |

OTHER PUBLICATIONS

Patent Abstracts of Japan, Publication No. 05-063091, Publication Date Mar. 12, 1993.
Patent Abstracts of Japan, Publication No. 07-022508, Publication Date Jan. 24, 1995.

* cited by examiner

*Primary Examiner* — Peniel M Gumedzoe
*Assistant Examiner* — Christopher Johnson
(74) *Attorney, Agent, or Firm* — Adams & Wilks

(57) ABSTRACT

A semiconductor device has a field insulating film formed on a semiconductor substrate, a resistor and a fuse formed on the field insulating film, a first interlayer insulating film formed on the fuse, a second interlayer insulating film formed on the first interlayer insulating film, and a third interlayer insulating film including an SOG layer and formed on the second interlayer insulating film. A passivation oxide film is formed on the third interlayer insulating film. A fuse opening is formed above the fuse and extends from the passivation oxide film to a midpoint in the second interlayer insulating film. A passivation nitride film covers the passivation oxide film and is disposed on a side surface and a bottom surface of the fuse opening. The passivation nitride film disposed on the bottom surface of the fuse opening has an opening exposing the second interlayer insulating film at the midpoint thereof.

13 Claims, 11 Drawing Sheets

SEMICONDUCTOR DEVICE

BACKGROUND OF THE INVENTION

1. Field of the Invention

The present invention relates to a semiconductor device including a CMOS transistor, a resistor, and a fuse for laser trimming.

2. Description of the Related Art

In a highly accurate analog IC used for a voltage detector or the like, a transistor and a resistor are combined in order to obtain desired characteristics. To accomplish this, a measure generally taken involves blowing out a fuse for laser trimming formed of, for example, a polycrystalline silicon thin film by laser radiation. By this measure, the combination pattern of resistors is adjusted in order to adjust variations in characteristics during a pre-process stage of the manufacture of the analog IC, such as during processing of a semiconductor wafer or adjustment of a target value.

Such a fuse for laser trimming in an analog IC is described with reference to FIG. 4 to FIG. 6. FIG. 4 is a plan view, FIG. 5 is a schematic sectional view taken along the line C-C, and FIG. 6 is a schematic sectional view taken along the line D-D. A fuse 206 formed of a polycrystalline silicon thin-film resistor is provided on a field insulating film 203 formed on a surface of a P-type semiconductor substrate 201. A nitride film 220 and an oxide film 219 as protective films and interlayer insulating films 216 and 214 among multilayer wirings are partly etched from the surface thereof to form a fuse opening 222 so that a laser can be radiated to the fuse 206. In the fuse opening 222, side walls of the nitride film, the interlayer insulating films, and the like are exposed. In a multilayer wiring process which is a double or more metal process, as a technology for planarization, for example, a technology is used in which, after coating an SOG layer formed of spin-on-glass (SOG), etching back is performed. SOG has excellent characteristics as a material used for etching back, but, generally, has the feature of being high in hygroscopicity. Because of that, when, after the etching back, an SOG layer 217 between the stacked interlayer insulating films remains, moisture enters through the SOG layer, which may cause fluctuations in element characteristics of the IC, resulting in occurrence of a problem related to the long-term reliability. In particular, in a PMOS transistor, it is known that negative bias temperature instability (NBTI) which is caused when a negative gate bias is applied in a high temperature state causes a shift of the threshold voltage of the transistor.

The fuse opening is further described below. By adjusting the thickness of an interlayer insulating film above the fuse by patterning by photolithography and then etching the fuse opening 222, prevention of defective trimming such as insufficient cut in the laser trimming is sought. In a related-art structure, after the passivation nitride film 220 as the final protective film is deposited, the passivation nitride film 220 in the fuse opening 222 and a pad portion (not shown) is partly removed, and then, etching is performed again so that the interlayer insulating film above the fuse has a predetermined thickness.

It is noted that rings 221 formed of first and second metal wirings for preventing entry of moisture are provided between the fuse opening 222 and an IC chip. The guard rings 221 are provided, and the SOG layer 217 used as an interlayer insulating film is cut so as to be prevented from reaching the inside of the chip as illustrated in FIG. 5.

However, an oxide film as an insulating film is exposed at the side walls of the interlayer insulating films in the fuse opening. In the insulating film layer in which etching back of the SOG is performed, the SOG layer is exposed. It follows that entry of moisture occurs, which may result in not only NBTI but also corrosion of metal wiring or the like, leading to deterioration of characteristics of the IC.

For example, Japanese Published Patent Application Hei 05-63091 and Hei 07-22508 disclose measures for preventing entry of moisture by forming a guard ring using a metal as a barrier from the fuse opening to the inside of the IC, in order to prevent deterioration of the long-term reliability owing to such entry of moisture through the fuse opening.

In an analog IC, size reduction of each component is indispensable for reducing the chip size. If the distance from the fuse opening is secured for the purpose of inhibiting fluctuations in element characteristics and corrosion of metal wiring owing to entry of moisture through a fuse portion, the chip size is increased to lose competitiveness.

Further, with regard to a measure of forming a guard ring as a barrier using metal wiring for the purpose of preventing entry of moisture through the SOG, a shift of characteristics caused by NBTI or the like is effectively inhibited, but, because the SOG layer is exposed in the fuse opening, the guard ring of metal wiring may cause corrosion of wiring.

SUMMARY OF THE INVENTION

Accordingly, an object of the present invention is to provide a semiconductor device which can prevent deterioration of the long-term reliability and corrosion of wiring caused by entry of moisture owing to a fuse opening.

In order to achieve the object, according to the present invention, there is provided a semiconductor device, including:

a semiconductor substrate;

a field insulating film formed on a surface of the semiconductor substrate;

a resistor and a fuse formed on the field insulating film;

a first interlayer insulating film formed on the fuse;

a second interlayer insulating film formed on the first interlayer insulating film;

a third interlayer insulating film formed on the second interlayer insulating film and including an SOG layer therein;

a passivation oxide film formed on the third interlayer insulating film;

a fuse opening formed above the fuse by removing films from the passivation oxide film to a midpoint in the second interlayer insulating film; and a passivation nitride film covering the passivation oxide film and a side surface and a side bottom surface of the fuse opening, in which the passivation nitride film is removed so that the second interlayer insulating film is exposed from the passivation nitride film on a bottom surface of the fuse opening.

Further, in the semiconductor device the fuse includes a first polycrystalline silicon.

Further, in the semiconductor device the resistor includes a second polycrystalline silicon which is different from the first polycrystalline silicon.

Further, in the semiconductor device: the first interlayer insulating film includes a BPSG layer and an NSG layer; the second interlayer insulating film includes a plasma TEOS silicon oxide film; and the third interlayer insulating film includes a plasma TEOS silicon oxide film, an SOG, and a plasma TEOS silicon oxide film.

Further, the semiconductor device further includes a guard ring including a metal wiring material, the guard ring surrounding a periphery of the fuse opening.

In an IC having multilayer wiring formed therein, a moisture entry path through a side wall of the stacked interlayer insulating films from the fuse opening which may cause deterioration of the long-term reliability can be shut off without fail to prevent deterioration of characteristics of the IC due to NBTI and corrosion of wiring.

DETAILED DESCRIPTION OF THE PREFERRED EMBODIMENTS

Embodiments of the present invention are described below with reference to the attached drawings.

First Embodiment

Figure 1:
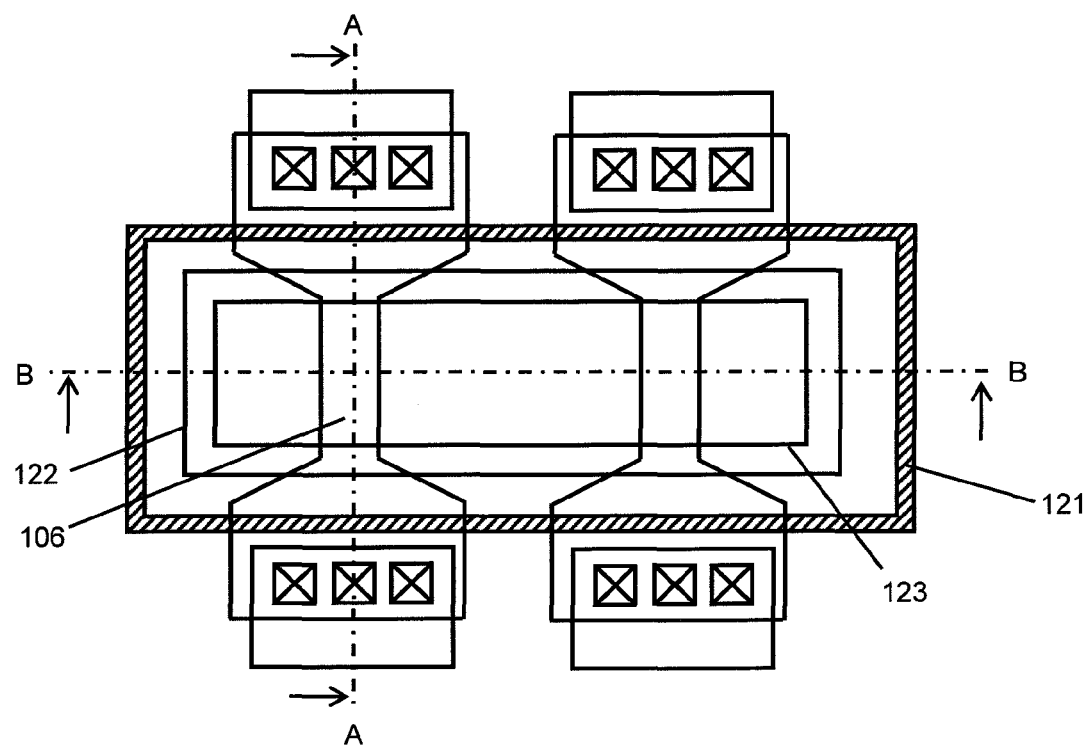
FIG. 1 is a schematic plan view of a fuse portion according to a first embodiment of the present invention.
Figure 2:
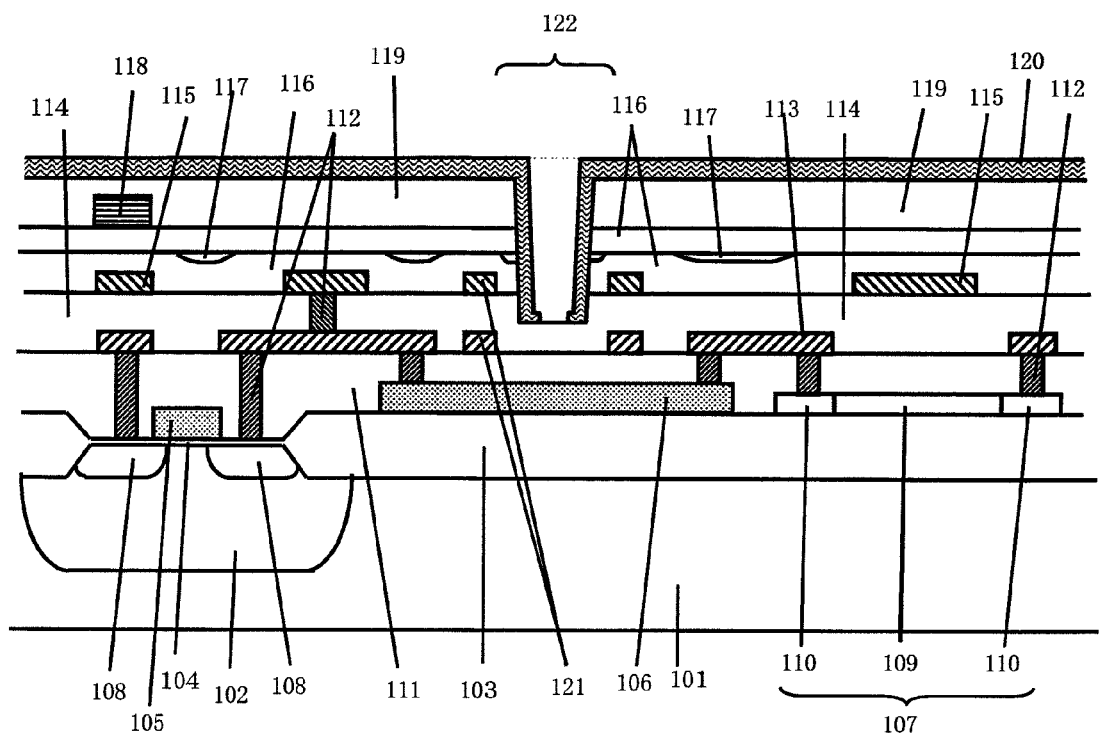
FIG. 2 is a schematic sectional view taken along the line A-A of a semiconductor device including the fuse portion according to the first embodiment of the present invention.
Figure 3:
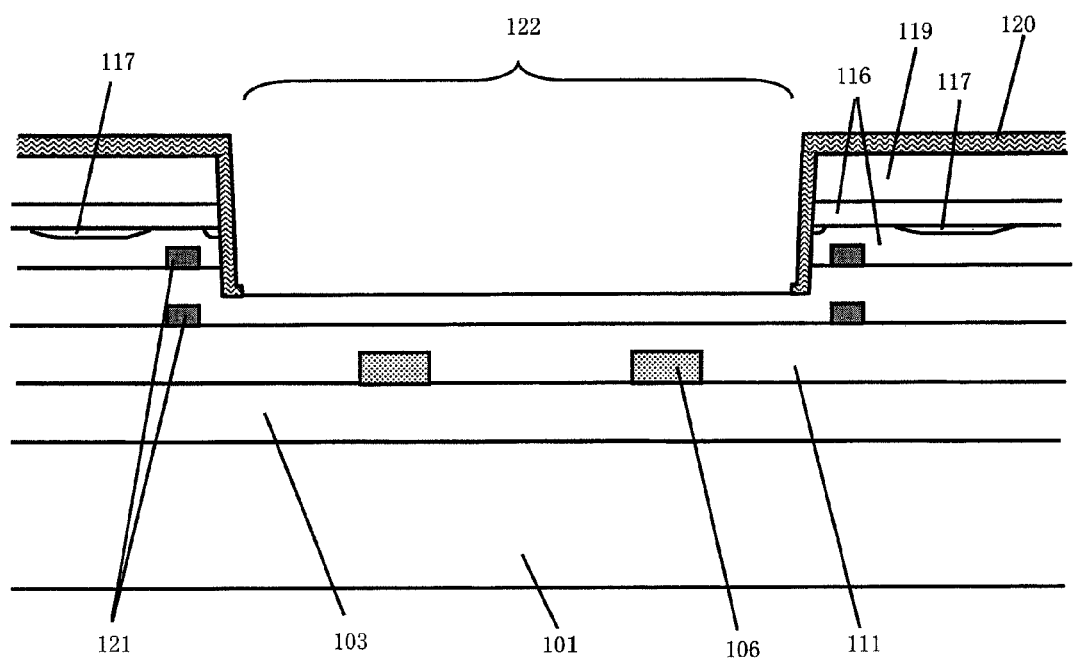
FIG. 3 is a schematic sectional view taken along the line B-B of the semiconductor device including the fuse portion according to the first embodiment of the present invention.
Figure 4:
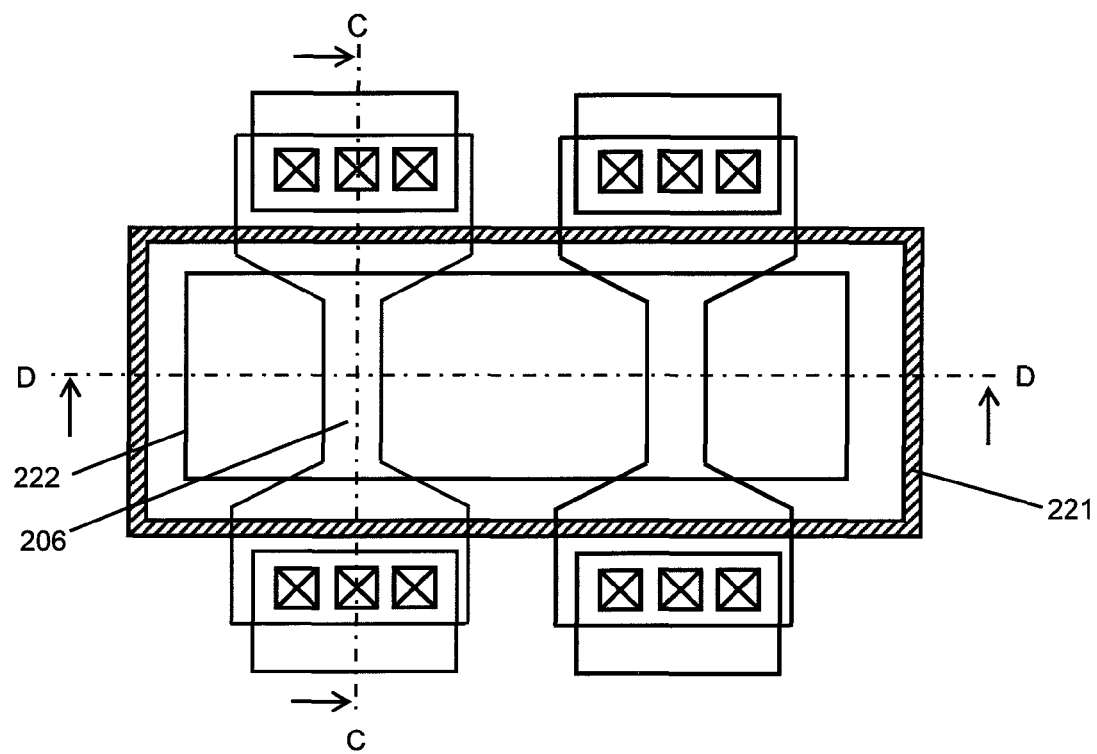
FIG. 4 is a schematic plan view of a related-art fuse portion.
Figure 5:
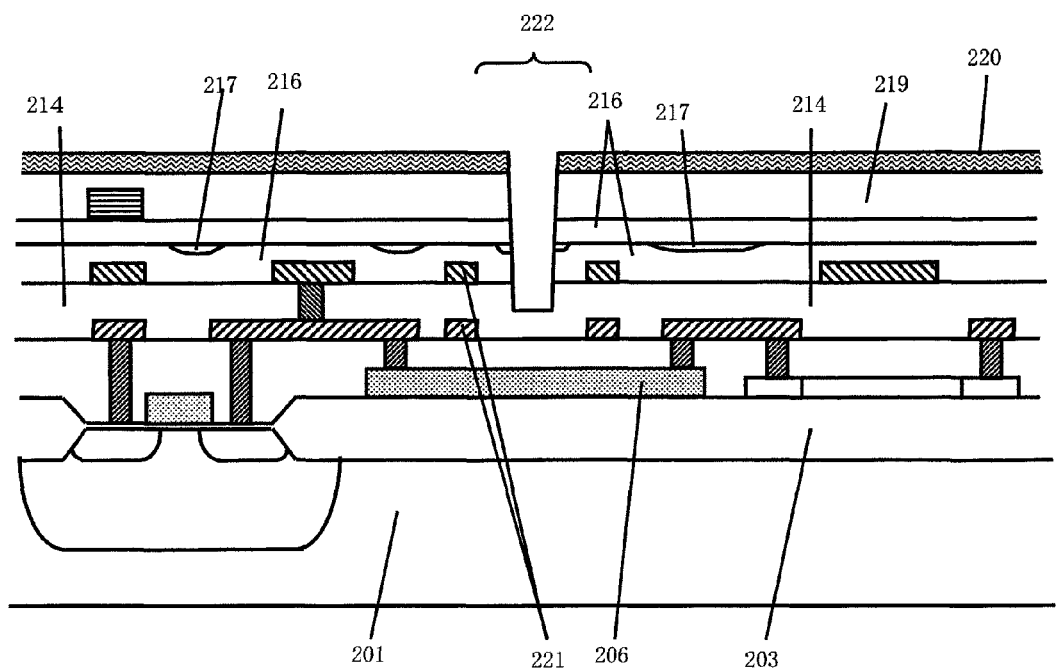
FIG. 5 is a schematic sectional view taken along the line C-C of a semiconductor device including the related-art fuse portion.
Figure 6:
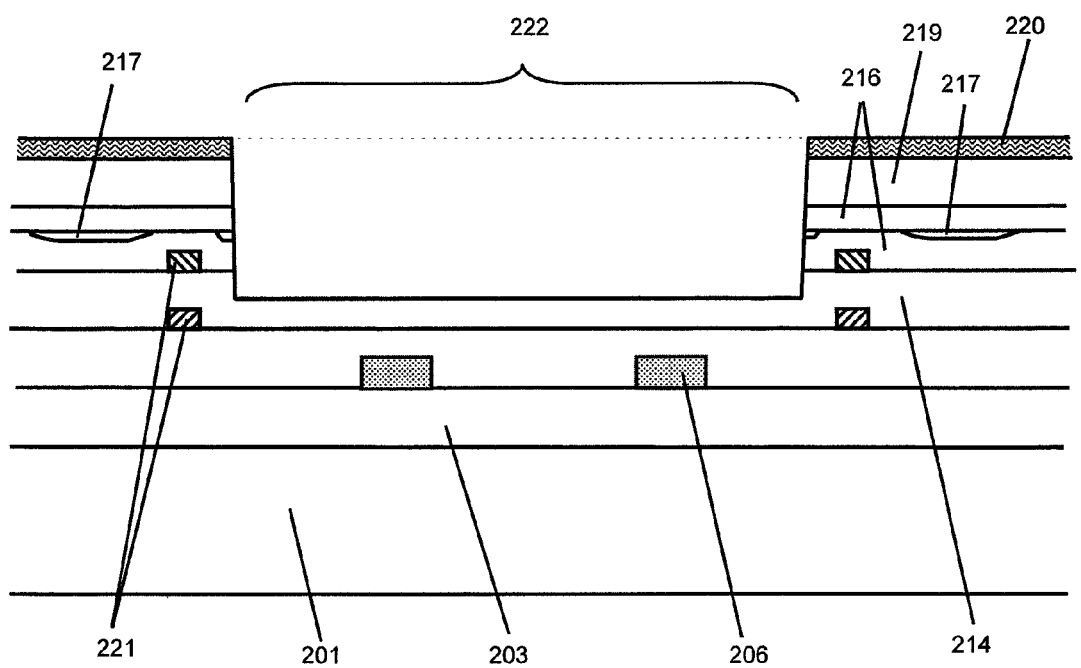
FIG. 6 is a schematic sectional view taken along the line D-D of the semiconductor device including the related-art fuse portion.

FIG. 1 is a plan view of a fuse portion of a semiconductor device according to an embodiment of the present invention, and FIG. 2 and FIG. 3 are schematic sectional views of the same semiconductor device.

FIG. 2 is a schematic sectional view of the semiconductor device taken along the line A-A of FIG. 1. FIG. 3 is a schematic sectional view of the semiconductor device taken along the line B-B of FIG. 1. An N-type well diffusion layer 102 in a PMOS region and a P-type well diffusion layer (not particularly shown) in an NMOS region are formed on a P-type silicon semiconductor substrate 101. A field insulating film 103 which is an oxide film formed by LOCOS is formed at a thickness of, for example, about 4,000 Å to 8,000 Å.

Then, a gate insulating film 104 by thermal oxidation is formed at a thickness of about 100 Å to 400 Å. After ions are implanted so as to obtain a desired threshold voltage, a polycrystalline silicon film to be a gate electrode is deposited by CVD and patterning is performed with a photoresist to form a gate electrode 105 and a fuse 106 to be cut by laser trimming. At this time, phosphorus and boron are diffused in the polycrystalline silicon film to be the gate electrode 105 and the fuse 106 by ion implantation or doped-CVD so that the polarity of the electrode is the N-type or the P-type. After that, a second polycrystalline silicon is deposited, and ion implantation of a low concentration impurity into the second polycrystalline silicon is performed so as to form a resistor. In this case, any one of a P-type resistor and an N-type resistor may be formed. Further, the formation may be performed by doped-CVD. After that, a photolithography process is performed, and then, etching is performed and a pattern is formed to form a high resistance resistor 107.

After that, a P-type high concentration impurity region 108 to be a drain and a source of a PMOS transistor and an N-type high concentration impurity region to be a source and a drain of an NMOS transistor (not particularly shown) are formed. Further, in order to cause the resistance of a contact portion of the resistor to be low, at the same time, ions of a P-type or an N-type high concentration impurity are implanted into a low concentration region 109 of the resistor, and high concentration regions 110 are formed at both ends of the resistor.

Next, a first interlayer insulating film 111 is formed, for example, through deposition by atmospheric pressure CVD at a thickness of 5,000 Å to 20,000 Å. The first interlayer insulating film may have a single layer structure of a BPSG film containing boron and phosphorus, or may have a two layer structure including a non-doped NSG film and a BPSG film. After the first interlayer insulating film is stacked, planarization is performed in a CMP process so that the thickness is as desired, for example, 10,000 Å from the silicon substrate. Note that, CMP is used in the planarization in this case, but the planarization may be performed by reflowing which is conventionally used.

After that, contact holes 112 are formed. After so-called plug structures in which a high-melting metal such as tungsten is embedded are formed, a first metal wiring 113 is deposited by, for example, sputtering, at a thickness of 3,000 Å to 8,000 Å. In order to prevent a spike in the contact, a barrier metal layer formed of Ti and TiN may be formed before tungsten is embedded. As the metal wiring 113, Al—Si, Al—Si—Cu, or Al—Cu may be used. Then, the first metal wiring 113 is formed by photolithography and etching.

Then, in order to form multilayer wiring, a second interlayer insulating film 114 is formed, for example, of a TEOS oxide film by plasma CVD at a thickness of 5,000 Å to 15,000 Å. Similarly to the case of the first interlayer insulating film, planarization is performed in a CMP process so that the interlayer insulating film has a desired thickness of, for example, about 5,000 Å. After that, a contact hole for connection to the first metal wiring is formed. After a plug structure in which a high-melting metal such as tungsten is embedded is formed, a second metal wiring 115 is deposited by, for example, sputtering, at a thickness of 3,000 Å to 8,000 Å. Before the plug structure is formed, a barrier metal layer formed of Ti and TiN may be formed. As the metal wiring 115, Al—Si, Al—Si—Cu, or Al—Cu may be used. Then, a pattern of the second metal wiring 115 is formed by photolithography and etching.

After the second metal wiring 115 is formed, a third interlayer insulating film 116 is deposited of a TEOS oxide film by plasma CVD. In this case, for the purpose of planarization, after coating a surface of the third interlayer insulating film with a spin on glass (SOG) layer 117, etching back is performed, and further, the TEOS oxide film 116 is deposited. Because SOG can perform planarization more easily than a CMP process, there are cases in which SOG is used with regard to an interlayer insulating film on which the uppermost layer metal wiring is deposited in a multilayer wiring process.

Then, a contact hole is formed in the third interlayer insulating film including the TEOS oxide film formed by plasma CVD and the SOG layer. After a plug structure in which a high-melting metal such as tungsten is embedded is formed, similarly to the first and second metal wirings, a third metal wiring 118 is deposited by, for example, sputtering, at a thickness of 3,000 Å to 30,000 Å. The third metal wiring 118 may be, for example, Al—Si, Al—Si—Cu, or Al—Cu. Then, a pattern of the third metal wiring 118 is formed by photolithography and etching.

Then, through formation of two-layer passivation film including a passivation oxide film 119 and a passivation nitride film 120 as a final protective film and patterning of the passivation oxide film, the insulating film, and the passivation nitride film, in a pad opening and in a fuse opening 122, the semiconductor device is manufactured.

In this case, guard rings 121 formed of the first and second metal wirings are provided in the shape of a rectangle so as to surround a periphery of the fuse opening 122 for the purpose of preventing entry of moisture through the fuse opening 122 to the inside of the IC chip. As illustrated in FIG. 2, the guard rings 121 is provided, and the SOG layer 117 used as an interlayer insulating film can be cut so as to be prevented from directly extending to and reach the inside of the IC chip.

Further, in this embodiment, as illustrated in FIG. 1, FIG. 2, and FIG. 3, a side wall and a side bottom surface which is a region on the periphery of a bottom surface and at which the bottom surface and the side wall intersect each other of the fuse opening 122, where the interlayer insulating films are exposed, are covered with the passivation nitride film 120. The passivation nitride film 120 is removed from the bottom surface of the fuse opening 122 except for the side bottom surface. The passivation nitride film 120 has an opening 123 in a shape different from that of the fuse opening 122 on the bottom surface of the fuse opening 122. In the fuse opening 122, the exposed film is only the second interlayer insulating film on the bottom surface except for the side bottom surface. Such a structure enables prevention of entry of moisture through a gap formed due to reduced adhesion at interfaces among the stacked first, second, and third interlayer insulating films. Further, because the SOG layer is similarly covered with the passivation nitride film 120, entry of moisture through the SOG layer can be inhibited.

Further, the etching of the fuse opening 122 is performed to stop at a midpoint in the second interlayer insulating film. This is because, if the etching reaches the first interlayer insulating film, the hygroscopic BPSG layer is exposed, and, even if the side wall is covered with the passivation nitride film 120, moisture can easily enter the inside of the IC chip through the BPSG layer. Further, if the etching of the fuse opening 122 stops in the third interlayer insulating film 116, the SOG layer 117 is again exposed and can be a moisture entry path. By stopping the etching of the opening in the second interlayer insulating film which is a plasma TEOS layer through which moisture is less liable to enter compared with the cases of other oxide films, defective trimming of the fuse can be inhibited, and at the same time, deterioration of the IC characteristics owing to entry of moisture can be prevented.

A method of manufacturing the semiconductor device according to the foregoing embodiment is now described. Although not illustrated in the figures, after the third metal wiring is formed, first, the passivation oxide film 119 of the two-layer passivation film is deposited by plasma CVD, and then, the fuse opening is etched at a midpoint in the second interlayer insulating film to form the fuse opening 122. Then, after the passivation nitride film is deposited, by, for the purpose of forming the pad openings and the fuse opening, partly removing the passivation nitride film, the final form of the semiconductor device described in this embodiment is obtained.

Second Embodiment

Figure 7:
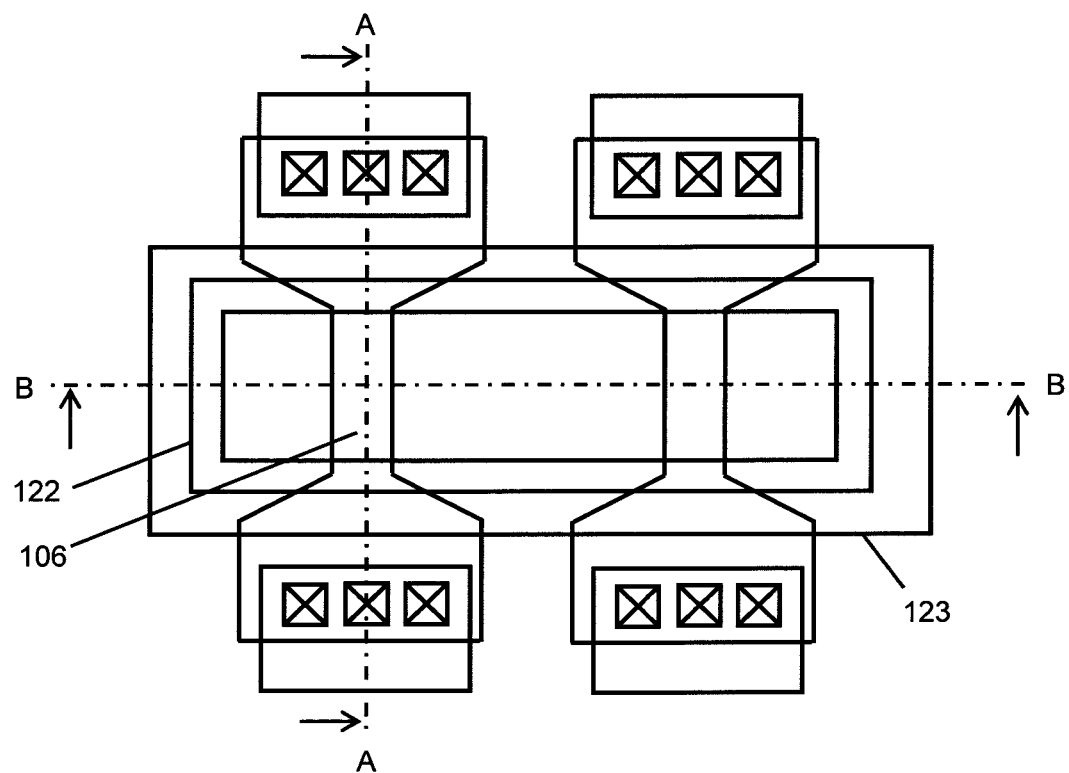
FIG. 7 is a schematic plan view of a fuse portion according to a second embodiment of the present invention.
Figure 8:
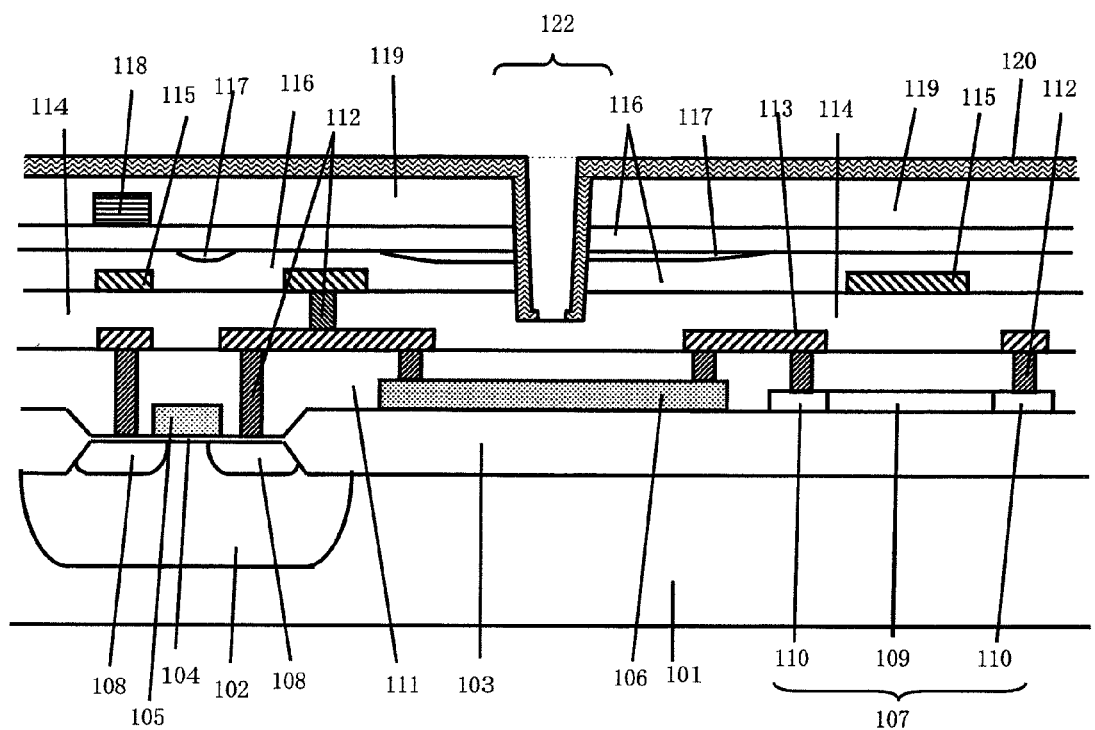
FIG. 8 is a schematic sectional view taken along the line A-A of a semiconductor device including the fuse portion according to the second embodiment of the present invention.
Figure 9:
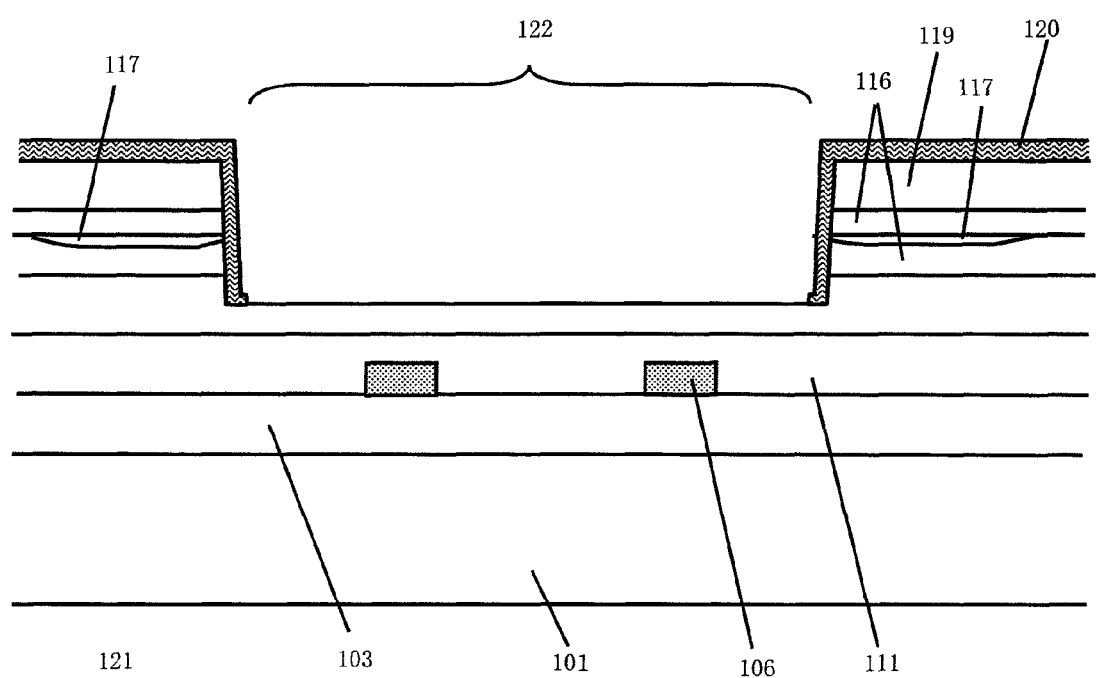
FIG. 9 is a schematic sectional view taken along the line B-B of the semiconductor device including the fuse portion according to the second embodiment of the present invention.

Next, a modification of the first embodiment described above as a second embodiment of the present invention is described with reference to FIG. 7 to FIG. 9. FIG. 7 is a plan view illustrating a fuse portion of the modification. FIG. 8 is a schematic sectional view of the semiconductor device taken along the line A-A of FIG. 7. FIG. 9 is a schematic sectional view of the semiconductor device taken along the line B-B of FIG. 7.

As is apparent from FIG. 7, in this modification, the guard rings (denoted by reference numeral 121 in FIG. 1 to FIG. 3) formed of the first and second metal wirings are not provided so as to surround the periphery of the fuse opening. The second embodiment is similar to the first embodiment with regard to other points. This is because, when it is confirmed that the resistance of the passivation nitride film 120 to the entry of moisture is sufficient, the guard rings formed of the first and second metal wirings as one of the double defensive measures against entry of moisture can be eliminated. Without the guard rings around the periphery of the fuse opening, the SOG layer is not cut and the SOG layer may extend to the inside of the IC chip as illustrated in FIG. 8 and FIG. 9. However, because the passivation nitride film 120 formed in the fuse opening sufficiently prevents entry of moisture, there is no necessity of concerns about the entry of moisture through the SOG layer.

The structure of the second embodiment has an effect that the length of the entire fuse along the line A-A can be reduced insofar as permitted by the manufacturing process in accordance with the space of the eliminated guard rings.

Third Embodiment

Figure 10:
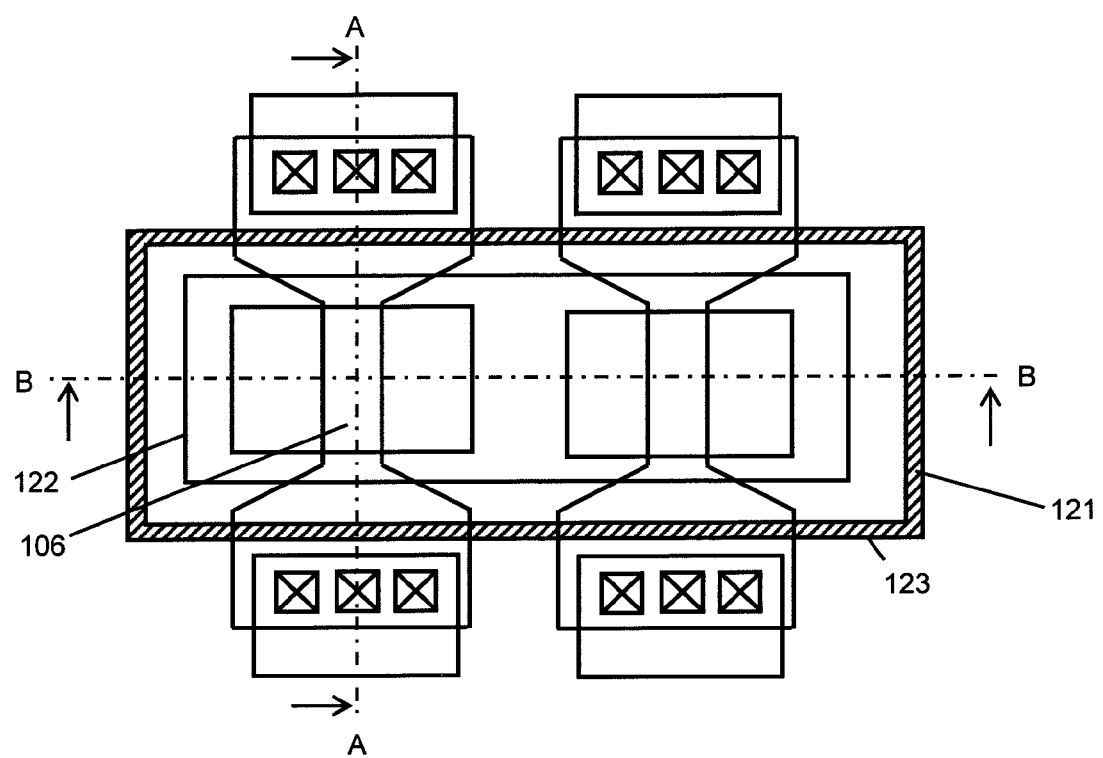
FIG. 10 is a schematic plan view of a fuse portion according to a third embodiment of the present invention.
Figure 11:
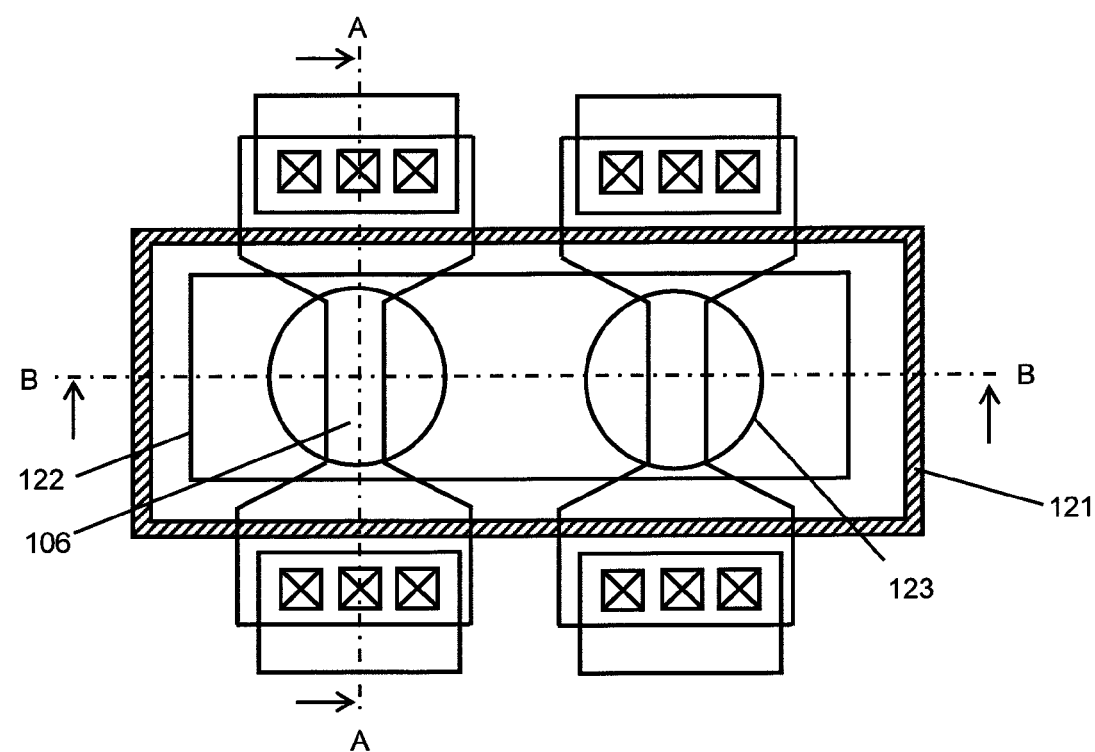
FIG. 11 is a schematic plan view of a fuse portion according to a modification of the third embodiment of the present invention.

Next, a third embodiment of the present invention is described with reference to FIG. 10 and FIG. 11. FIG. 10 is a plan view illustrating a fuse portion of the third embodiment, and FIG. 11 is a plan view of a fuse portion as a modification of the third embodiment. In the third embodiment, the opening 123 in the passivation nitride film 120 which determines the final shape of the fuse opening is shaped so as to be independent from openings of other fuses. The shape of the opening 123 in each fuse is rectangle in FIG. 10, and is a circle in FIG. 11 which illustrates the modification. Because the shape of the opening 123 is determined by the patterning of the passivation nitride film 120, no additional process is necessary. Because, by providing independent openings in the respective fuses in this way, only the portion of the fuse which is cut in laser trimming is exposed, and peripheries thereof which surround the portion are covered with the passivation nitride film 120. Accordingly, the effect of contamination due to the residual fuse which is blown out at high temperature is reduced, and further, the effect of expansion due to raised temperature of the peripheries of the fuse which is blown out is reduced.

In the embodiments described above, three-layer metal wiring processes are described by way of example, but it is understood that the present invention is similarly applicable to a multilayer wiring process in which there are four or more layers.

What is claimed is:

1. A semiconductor device, comprising:
   a semiconductor substrate;
   a field insulating film formed on a surface of the semiconductor substrate;
   a resistor and a plurality of fuses formed on the field insulating film, the plurality of fuses being made of a first polycrystalline silicon and the resistor being made of a second polycrystalline silicon different from the first polycrystalline silicon;
   a first interlayer insulating film formed on the plurality of fuses;
   a first metal wiring formed on the first interlayer insulating film;
   a second interlayer insulating film formed on the first interlayer insulating film;
   a second metal wiring formed on the second interlayer insulating film;
   a third interlayer insulating film formed on the second interlayer insulating film and including an SOG layer therein;
   a third metal wiring formed on the third interlayer insulating film;
   a passivation oxide film formed on the third interlayer insulating film;
   a fuse opening formed above the plurality of fuses and extending from the passivation oxide film and into the second interlayer insulating film to a midpoint in the second interlayer insulating film, the fuse opening passing through the third interlayer insulating film so that the SOG layer in the third interlayer insulating film exists in a side wall of the fuse opening approximately halfway between the top of the passivation oxide film and the second interlayer insulating film, and the fuse opening being formed apart from the first, second and third metal wirings; and
   a passivation nitride film disposed on and covering the passivation oxide film, disposed on a side surface and a bottom surface of the fuse opening, and disposed on side surfaces of the second interlayer insulating film and the third interlayer insulating film only in the fuse opening;
   wherein the passivation nitride film is not disposed along an interface between the first interlayer insulating film and the second interlayer insulating film and is not disposed along an interface between the second interlayer insulating film and the third interlayer insulating film;
   wherein the passivation nitride film disposed on the bottom surface of the fuse opening has an opening exposing the second interlayer insulating film at the midpoint thereof;
   wherein the passivation nitride film is disposed apart from and is not in contact with the first, second and third metal wirings;
   wherein the resistor and the plurality of fuses are disposed under the first, second and third metal wirings;
   wherein no metal wiring is disposed inside of the fuse opening and under the bottom of the fuse opening;
   wherein the opening of the passivation nitride film has a shape different from a shape of the fuse opening; and
   wherein the passivation nitride film completely covers the side and bottom surfaces of the fuse opening, including corners of the fuse opening formed by the side and bottom surfaces, except for a portion of the bottom surface of the fuse opening that exposes the surface portion of the second interlayer insulating film.

2. A semiconductor device according to claim 1, further comprising a guard ring formed of a metal wiring material, the guard ring completely surrounding a periphery of the fuse opening and being completely apart from the fuse opening.

3. A semiconductor device according to claim 1, wherein no nitride film exists under the fuse opening.

4. A semiconductor device comprising:
   a semiconductor substrate;
   a field insulating film formed on a surface of the semiconductor substrate;
   a resistor and a fuse formed on the field insulating film;
   a first interlayer insulating film formed on the fuse;
   a first metal wiring formed on the first interlayer insulating film;
   a second interlayer insulating film formed on the first interlayer insulating film;
   a second metal wiring formed on the second interlayer insulating film;
   a third interlayer insulating film formed on the second interlayer insulating film and including an SOG layer therein;
   third metal wiring formed on the third interlayer insulating film;
   a passivation oxide film formed on the third interlayer insulating film;
   a fuse opening formed above the fuse and extending from the passivation oxide film and into the second interlayer insulating film to a midpoint in the second interlayer insulating film, the fuse opening passing through the third interlayer insulating film so that the SOG layer in the third interlayer insulating film exists in a side wall of the fuse opening approximately halfway between the top of the passivation oxide film and the second interlayer insulating film, and the fuse opening being formed apart from the first, second and third metal wirings; and
   a passivation nitride film disposed on and covering the passivation oxide film, disposed on a side surface and a bottom surface of the fuse opening, and disposed on side surfaces of the second interlayer insulating film and the third interlayer insulating film only in the fuse opening;
   wherein the passivation nitride film is not disposed along an interface between the first interlayer insulating film and the second interlayer insulating film and is not disposed along an interface between the second interlayer insulating film and the third interlayer insulating film;
   wherein the passivation nitride film disposed on the bottom surface of the fuse opening has an opening exposing the second interlayer insulating film at the midpoint thereof;
   wherein the passivation nitride film is disposed apart from and is not in contact with the first, second and third metal wirings;

wherein the passivation nitride film completely covers the side and bottom surfaces of the fuse opening, including corners of the fuse opening formed by the side and bottom surfaces, except for a portion of the bottom surface of the fuse opening that exposes the surface portion of the second interlayer insulating film;

wherein no metal wiring is disposed inside of the fuse opening and under the bottom of the fuse opening;

wherein the opening of the passivation nitride film has a shape different from a shape of the fuse opening;

wherein the fuse comprises a plurality of fuses made of a first polycrystalline silicon, the resistor being made of a second polycrystalline silicon different from the first polycrystalline silicon;

wherein the resistor and the plurality of fuses are disposed under the first, second and third metal wirings; and wherein the opening in the passivation nitride film comprises independent openings formed above each of the plurality of fuses in the passivation nitride film.

5. A semiconductor device according to claim 4, wherein no nitride film exists under the fuse opening.

6. A semiconductor device according to claim 4, further comprising a guard ring completely surrounding a periphery of the fuse opening and being completely apart from the fuse opening.

7. A semiconductor device comprising:
a semiconductor substrate;
a field insulating film formed on a surface of the semiconductor substrate;
a resistor and a plurality of fuses formed on the field insulating film, the plurality of fuses being made of a first polycrystalline silicon and the resistor being made of a second polycrystalline silicon different from the first polycrystalline silicon;
a first interlayer insulating film formed on the plurality of fuses;
a first metal wiring formed on the first interlayer insulating film;
a second interlayer insulating film formed on the first interlayer insulating film;
a second metal wiring formed on the second interlayer insulating film;
a third interlayer insulating film formed on the second interlayer insulating film and including an SOG layer therein;
third metal wiring formed on the third interlayer insulating film;
a passivation oxide film formed on the third interlayer insulating film;
a fuse opening formed above the plurality of fuses through the passivation oxide film and the third interlayer insulating film and into the second interlayer insulating film to a midpoint of the second interlayer insulating film so that the SOG layer of the third interlayer insulating film exists in a side wall of the fuse opening approximately halfway between the top of the passivation oxide film and the second interlayer insulating film, the fuse opening being formed apart from the first, second and third metal wirings; and
a passivation nitride film disposed on and covering the passivation oxide film and completely covering side and bottom surfaces of the fuse opening except for a portion of the bottom surface of the fuse opening so as to expose a surface portion of the second interlayer insulating film at the midpoint thereof, the passivation nitride film being disposed apart from and not in contact with the first, second and third metal wirings;
wherein the passivation nitride film is not disposed along an interface between the first interlayer insulating film and the second interlayer insulating film and is not disposed along an interface between the second interlayer insulating film and the third interlayer insulating film;
wherein the resistor and the plurality of fuses are disposed under the first, second and third metal wirings; and
wherein no metal wiring is disposed inside of the fuse opening and under the bottom of the fuse opening.

8. A semiconductor device according to claim 7, wherein the third interlayer insulating film includes an SOG layer.

9. A semiconductor device according to claim 7, wherein the surface portion at the midpoint of the second interlayer insulating film is exposed by an opening formed in the passivation nitride film at the bottom surface of the fuse opening, the opening in the passivation nitride film having a shape different than that of the fuse opening.

10. A semiconductor device according to claim 7, further comprising a guard ring completely surrounding a periphery of the fuse opening and being completely apart from the fuse opening.

11. A semiconductor device according to claim 10, wherein the guard ring is formed of metal wiring material.

12. A semiconductor device according to claim 7, wherein the opening in the passivation nitride film comprises a plurality of independent openings formed above the plurality of fuses in the passivation nitride film.

13. A semiconductor device according to claim 7, wherein no nitride film exists under the fuse opening.

* * * * *